(12) United States Patent
Feldtkeller

(10) Patent No.: US 8,427,852 B2
(45) Date of Patent: Apr. 23, 2013

(54) SIGNAL TRANSMISSION ARRANGEMENT WITH A TRANSFORMER

(75) Inventor: Martin Feldtkeller, Munich (DE)

(73) Assignee: Infineon Technologies Austria AG, Villach (AT)

( * ) Notice: Subject to any disclaimer, the term of this patent is extended or adjusted under 35 U.S.C. 154(b) by 424 days.

(21) Appl. No.: 12/772,744

(22) Filed: May 3, 2010

(65) Prior Publication Data

US 2011/0267861 A1    Nov. 3, 2011

(51) Int. Cl.
*H02M 7/00* (2006.01)
(52) U.S. Cl.
USPC .......................................................... 363/64
(58) Field of Classification Search .................. None
See application file for complete search history.

(56) References Cited

U.S. PATENT DOCUMENTS

| 5,457,407 | A | 10/1995 | Shu et al. | |
| 7,551,463 | B2 * | 6/2009 | Ros et al. | 363/89 |
| 2009/0001932 | A1 * | 1/2009 | Kamijo et al. | 320/108 |

FOREIGN PATENT DOCUMENTS

CA    2 606 980 A1    4/2009

* cited by examiner

*Primary Examiner* — Lincoln Donovan
*Assistant Examiner* — Khareem E Almo
(74) *Attorney, Agent, or Firm* — Slater & Matsil, L.L.P.

(57) ABSTRACT

A signal transmission arrangement includes a transformer with a first and a second winding. A damping circuit has an input terminal for receiving an input signal. The damping circuit is coupled to the first winding and is configured to have an electrical resistance that is dependent on the input signal. An oscillator circuit includes the second winding and is configured to provide an oscillating signal. An evaluation circuit is configured to receive the oscillating signal and to provide an output signal that is dependent on an amplitude of the oscillating signal.

20 Claims, 9 Drawing Sheets

SIGNAL TRANSMISSION ARRANGEMENT WITH A TRANSFORMER

TECHNICAL FIELD

Embodiments of the present invention relate to a signal transmission arrangement with a transformer, in particular a coreless transformer, and a signal transmission method.

BACKGROUND

Transformers, such as coreless transformers, can be used to transmit signals across a potential barrier between circuits or circuit parts that have different reference potentials. A transformer can, for example, be used to transmit a feedback signal from a secondary side controller to a primary side drive circuit in a switched-mode power supply, or from a control unit to a drive circuit of a High-Side switch.

Known signal transmission arrangements with a transformer transmit digital signals. In case an analog signal is to be transmitted an analog-to-digital conversion in a transmitter circuit coupled with a first winding of the transformer and a digital-to-analog conversion in a receiver circuit coupled with a second winding of the transformer is required.

There is, therefore, a need for a signal transmission arrangement with a transformer that is capable of transmitting analog signals, such as feedback signals in a switched-mode power supply.

SUMMARY OF THE INVENTION

A first aspect relates to a signal transmission arrangement, including a transformer having a first and a second winding. A damping circuit has an input terminal for receiving an input signal, coupled to the first winding, and is configured to have an electrical resistance that is dependent on the input signal. An oscillator circuit includes the second winding and is configured to provide an oscillating signal. An evaluation circuit is configured to receive the oscillating signal, and provides an output signal that is dependent on an amplitude of the oscillating signal.

A second aspect relates to a signal transmission method that includes providing a signal transmission arrangement with a transformer having a first and a second winding. An oscillator circuit includes the second winding and is configured to provide an oscillating signal. A damping circuit is connected to the first winding. A first signal to be transmitted is provided. The oscillating signal is dampened by varying an electrical resistance of the damping circuit dependent on the first signal. A second signal that is dependent on an amplitude of the oscillating signal is generated.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF ILLUSTRATIVE EMBODIMENTS

Figure 1:
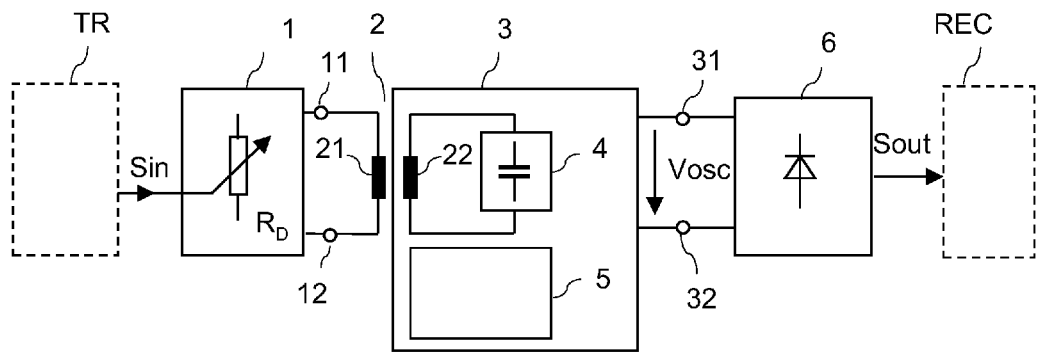
FIG. 1 schematically illustrates an embodiment of a signal transmission arrangement with a transformer, a damping circuit receiving an input signal, an oscillator circuit, and an evaluation circuit providing an output signal.

FIG. 1 schematically illustrates one embodiment of a signal transmission arrangement that is suitable for transmitting a first signal Sin. The first signal Sin is, for example, provided by a transmitter circuit TR (shown in dashed lines). The signal transmission arrangement is configured to receive the first signal Sin, that will also be referred to as input signal in following, and to provide a second signal Sout, that will also be referred to as output signal in the following. The output signal Sout is, for example, received by a receiver circuit REC (shown in dashed lines). The signal transmission arrangement is, in particular, suitable to transmit the input signal Sin across a potential barrier that is present between two circuits or circuit parts of a system that have different reference potentials.

The signal transmission arrangement can, for example, be used for transmitting a control signal from a secondary side controller in a switched-mode power supply to a primary side drive circuit for a switch. In this case transmitter circuit TR would be the secondary side controller and the receiver circuit REC would be the primary side drive circuit. According to another example the signal transmission arrangement can be used for transmitting a control signal from a control circuit to a drive circuit of a High-Side switch. In this case transmitter circuit TR would be the control circuit and receiver circuit REC would be the drive circuit.

The signal transmission arrangement includes a transformer 2 with a first winding 21 and a second winding 22 that are inductively coupled with each other. Any known transformer technology can be used to implement transformer 2. According to a first example, transformer 2 is a transformer with two planar windings. A planar winding is a winding in which an electrically conducting line that forms the winding is arranged in one plane. Transformers with planar windings can be implemented in or on semiconductor bodies (dies) or on printed circuit boards (PCB). Transformer 2 is, for example, a coreless transformer, which is a transformer without a transformer core. Coreless transformers and methods how to implement such transformers are commonly known so that no further explanations are required in this regard.

The signal transmission arrangement further includes a damping circuit 1 that is configured to receive the input signal Sin and that is connected to the first winding 21 via output terminals 11, 12. Damping circuit 1 has an electrical resistance $R_D$ or an electrical conductance $G_D$, with $G_D=1/R_D$, that is effective between the output terminal and that is dependent on the input signal Sin.

The second winding 22 of the transformer 2 is part of an oscillator circuit 3 that is configured to provide an oscillating signal Vosc between output terminals 31, 32. An evaluation circuit 6 is connected to the output terminals 31, 32 of the oscillator circuit 3, receives the oscillating signal Vosc, and is configured to generate the output signal Sout dependent on an amplitude of the oscillating signal Vosc. Evaluation circuit 6 is, for example, implemented as a peak detector that detects the peak voltage of the oscillating signal Vosc and generates the output signal Sout dependent, in particular proportional, to the peak value of the oscillating signal Vosc. Such peak detectors are commonly known so that no further explanations are required in this regard.

The oscillator circuit 3 includes an LC-circuit with the second winding 22 of the transformer 2 and with a capacitor circuit 4 having at least one capacitor. An amplifier circuit 5, that is only schematically illustrated in FIG. 1, is coupled to the LC-circuit and causes the LC-circuit to oscillate, i.e., to produce an oscillating signal. The oscillating signal Vosc of the oscillating circuit 3 can be the oscillating signal provided by the LC-circuit, can be an amplified signal generated from the oscillating signal of the LC-circuit, or can be any other signal that is dependent from the oscillating signal provided by the LC circuit. According to one embodiment the oscillating signal Vosc of the oscillator circuit 3 is proportional to the oscillating signal generated by the LC-circuit 22, 4.

It is commonly known that the amplitude of an oscillating signal generated by a LC-circuit is dependent on a damping of the LC-circuit. In the embodiment illustrated in FIG. 1 of the signal transmission arrangement the LC-circuit is damped by the damping circuit 1 connected to the first winding 21 of the transformer 2. The damping circuit 1 influences the damping of the LC-circuit because of the inductive coupling between the first winding 21 and the second winding 22. The first and second windings 21, 22 can have identical winding senses. An inductive coupling factor between the first and the second winding 21, 22 is, for example, higher than 0.6, in particular higher than 0.8.

For transmitting the input signal Sin the signal transmission arrangement makes use of the fact that a damping of the LC-circuit and, thus, the amplitude of the oscillating signal Vosc is dependent on the electrical resistance $R_D$ of the damping circuit 1 between the output terminals 11, 12. By adjusting this electrical resistance $R_D$ dependent on the input signal Sin different amplitudes of the oscillating signal Vosc and, thus, different output signals Sout can be generated.

The signal transmission arrangement is, in particular, capable of transmitting an analog input signal Sin, i.e., an input signal Sin that can take any signal value within a given input signal range ranging from a minimum value $Sin_{min}$ to a maximum value $Sin_{max}$. The signal range of the input signal Sin, the corresponding resistance range of the resistance $R_D$ of the damping circuit 1, and the oscillator circuit 3 are adapted to one another such that there is a unique relationship between each of the signal values of the input signal range $[Sin_{min}, Sin_{max}]$ and corresponding amplitudes of the oscillator signal Vosc. "Adapting the oscillator circuit 3" to the resistance range of the damping circuit 1 means to implement the oscillator circuit 3 such that the oscillator circuit 3 is capable of providing an oscillating output signal Vosc for each of the resistance values of the resistance range.

Generally, any known type of oscillator circuit can be used to implement the oscillator circuit 3. Known oscillator circuits are, for example, Hartley oscillator circuits, Meissner oscillator circuits, or Colpitts oscillator circuits. Such oscillator circuits are commonly known. For illustration purposes an oscillator circuit 3 implemented as a Colpitts oscillator is illustrated in FIG. 2.

The oscillator circuit 3 is implemented as a Colpitts circuit in common-base connection. The capacitive circuit 4 includes a series circuit with a first and a second capacitive storage element 41, 42, such as a first and a second capacitor. The series circuit with the first and the second capacitor 41, 42 forms a capacitive voltage divider. A tap of the capacitive voltage divider is a circuit node that is common to the first and second capacitor 41, 42. The second winding 22 has a first terminal coupled with a terminal for a positive supply potential V+, and has a second terminal connected with the first capacitor 41. The second capacitor 42 of the capacitive voltage divider has the terminal that faces away from the tap connected to the terminal for the positive supply potential V+ via a third capacitor 43. The third capacitor 43 may have a large capacitance compared with the capacitances of the first and second capacitor 41, 42 and acts as a DC blocking capacitor. In the LC circuit the capacitive voltage divider is connected in parallel with the second winding 22 via the third capacitor 43.

Figure 2:
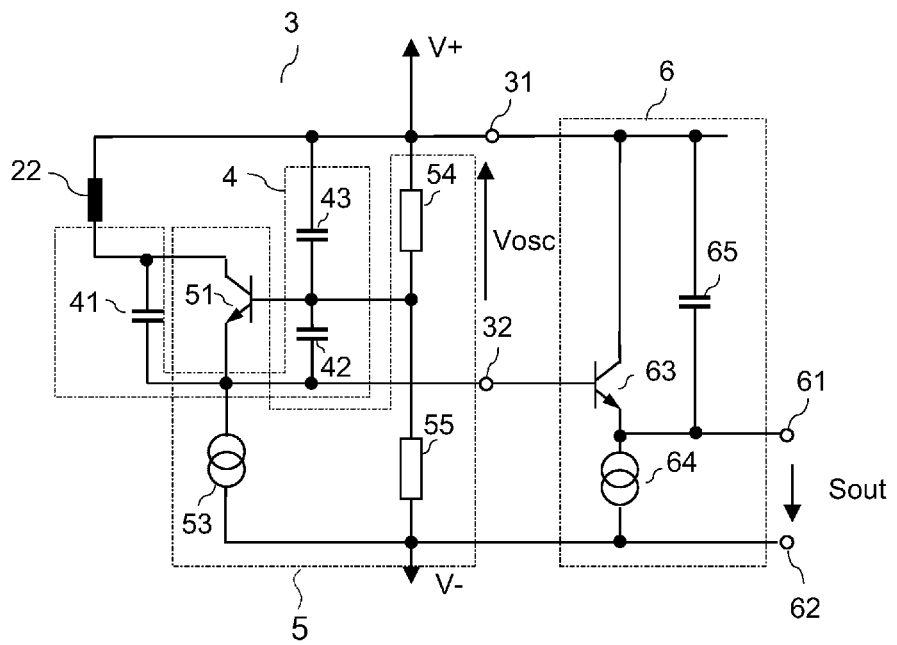
FIG. 2 illustrates one embodiment of an oscillator circuit.

The amplifier circuit 5 includes a transistor 51 that is implemented as a NPN bipolar transistor in the embodiment illustrated in FIG. 2. The transistor 51 has its emitter terminal connected to the tap of the capacitive voltage divider 41, 42, has its collector terminal connected with the circuit node that is common to the second winding 22 and the first capacitor 41, and has its base terminal connected to a circuit node common to the second and third capacitor 42, 43. The base of the transistor 51 is, thus, connected to the terminal for the positive supply potential V+ via the third capacitor 43.

Further, the amplifier circuit 5 includes a current source 53 connected between the tap of the capacitive voltage divider 41, 42 and a terminal for a negative supply potential or reference potential V−. The amplifier circuit 5 further includes a resistive voltage divider with a first and a second resistor 54, 55 connected in series between the terminals for the positive and the negative supply potential V+, V−, and with a tap that is connected with the base of the transistor. The resistive voltage divider serves to adjust the working point of the transistor 51.

When the LC circuit formed by the second winding 22 and the capacitive voltage divider 41, 42 (the third capacitor can be considered to either be part of the LC circuit or of the amplifier circuit 5) is excited, oscillating voltages occur across the second winding 22, the capacitive voltage divider 41, 42, and across each of the capacitors 41, 42, 43 wherein each of these oscillating voltages occurring in the LC circuit could be used as the oscillating output voltage Vosc. In the embodiment illustrated in FIG. 2 the oscillating output voltage Vosc is the voltage across the series circuit with the second and the third capacitor 42, 43. The first and second output terminals 31, 32 of the oscillating circuit 3 are the tap of the capacitive voltage divider 41, 42 and the terminal for the positive supply potential V+. The output voltage Vosc is, therefore, a voltage that oscillates relative to the positive supply potential, wherein, in the present example, an electrical potential at the first output terminal 31 is always below the positive supply potential V+. Thus, the oscillating signal Vosc in this case has a mean value that is below the positive supply potential V+ and above the negative supply potential V−.

The transistor 51 provides a positive feedback to the LC circuit. Each time a voltage across the second capacitor 42 is high enough to switch the transistor 51 on, the second winding 22 is magnetized by the current provided by the current source 53. Thus, in each period of the oscillating signal energy is provided to the LC circuit that keeps the LC circuit excited.

FIG. 2 also illustrates an embodiment of an evaluation circuit 6 that receives the oscillating signal Vosc at input terminals and provides the output signal Sout between output terminals 61, 62. The evaluation circuit includes a second transistor 63 which is implemented as a NPN transistor in the embodiment illustrated in FIG. 2. The second transistor 63 has its collector-emitter path connected in series with a current source 64, wherein a series circuit with the second transistor 63 and the current source 64 is connected between the terminals for the supply potentials V+, V−. This series circuit is connected to the output terminals 31, 32 of the oscillator circuit 3 such that the oscillating output voltage Vosc is a voltage between the base terminal and the collector terminal of the second transistor 63, wherein the collector terminal of this transistor 63 is connected to the terminal for the positive supply potential V+.

The evaluation circuit 6 further includes a capacitive storage element 65, such as a capacitor, connected between the collector and emitter of the second transistor 63. This capacitor 65 will be referred to as output capacitor in the following.

The first output 61 terminal of the evaluation circuit 6 is formed by the terminal that is common to the emitter of the second transistor 63 and the output capacitor 65, and the second output terminal 62 is formed by the terminal for the negative supply potential V−. Thus, in the present example, the output signal Sout is a voltage that is related to the negative supply potential V−.

The operating principle of the evaluation circuit 6 is as follows: The second transistor 63 switches on each time a potential difference between the potential at its base terminal and a potential at its emitter terminal, which is the first output terminal 61, is higher than the threshold voltage of the transistor 63. This threshold is about 0.7V in a silicon transistor. When the second transistor 63 is switched on, the output capacitor 65 is discharged so that the potential at the first output terminal 61 equals the potential at the base terminal of the second transistor 63 minus the threshold voltage.

The potential at the base terminal of the second transistor 63 relative to the negative supply potential V− equals the positive supply potential V+ minus the amplitude of the oscillating output signal Vosc. In each period of the oscillating output signal Vosc this potential reaches its maximum relative to the negative supply potential V− when the amplitude of the oscillating signal Vosc reaches its minimum. This maximum of the potential at the base terminal of the transistor 63 is, therefore, dependent on the absolute value of the maximum amplitude of the oscillating signal Vosc. The transistor 63 discharges the output capacitor 65 when the potential at its base terminal reaches its maximum. The capacitor 65 is discharged to a voltage value that is given by the difference between the positive supply potential V+ and the potential at the base terminal of the transistor 63 plus the threshold voltage of the transistor 63. Thus, the voltage across the capacitor 65 reaches a minimum value when the potential at the base terminal of the transistor 63 reaches a maximum relative to the negative supply potential V−. The output signal Sout is given by the difference between the supply voltage, which is the voltage between the positive and the negative supply potential V+, V−, and the voltage across the output capacitor 65. When the absolute value of the amplitude of the oscillating signal Vosc increases, the maximum potential at the base terminal of the transistor 63 increase, the voltage across the output capacitor 65 decreases, and, thus, the output signal Sout increases. Consequently, the output signal Sout reaches a signal value that is dependent on the absolute value of the maximum amplitude of the oscillating signal Vosc during one period. When the amplitude of the oscillating signal Vosc decreases after having received its maximum, the second transistor 63 is switched off, and the output capacitor 65 keeps the output signal Sout at the value it reached before. Thus, the transistor 63 and the capacitor 65 act as a peak voltage detector.

The output signal Sout may have a constant voltage offset that is dependent on the specific implementation of the oscillating circuit 3 and the evaluation circuit 6. The offset is additionally present to a signal component that is dependent on the absolute value of the amplitude of the oscillating signal Vosc.

When the second transistor 63 is switched off, the current source 64 charges the output capacitor 65 which causes the output signal Sout to decrease. The current source 64 is necessary to adapt the output signal Sout to a decreasing peak value of the oscillating signal Vosc. When the peak value of the oscillating signal Vosc increases, the capacitor 65 with every period of the oscillating signal Vosc is discharged, so that the output signal Sout is adapted to a "new" peak value with every period. However, when the peak value decreases a charging of the output capacitor 65 is required in order to adapt the output signal Sout to the decreasing peak value. This is done by the current source 64.

A charging current provided by the current source 64 and a capacitance of the output capacitor 65 are adapted to a frequency of the oscillating output signal Vosc such that charging the capacitor 65 by the current source 64 does not cause a significant change in the output signal Sout during one period of the oscillating signal, but, nevertheless, causes the output signal Sout to follow a decreasing peak value of the oscillating signal.

In the signal transmission arrangement of FIG. 1 the relationship between the input signal Sin and the resistance $R_D$ and the relationship between the resistance $R_D$ and the output signal Sout can be explained as follows:

$$R_D = f(\text{Sin}) \tag{1a}$$

$$\text{Sout} = g(R_D) \tag{1b}$$

In this connection f(.) denotes a function that maps the input signal Sin to the resistance $R_D$ of the damping circuit 1, and g(.) is the function that maps the resistance $R_D$ of the damping circuit 1 to the output signal Sout. Usually g(.) is a non-linear function. According to an embodiment there is a logarithmic relationship between the output signal Sout and the resistance $R_D$ for a given range of values of the resistance $R_D$ of the damping circuit 1, so that:

$$\text{Sout} = \text{Sout}_0 + \log(R_D) \tag{2},$$

wherein $R_D$ is selected from a signal range of the resistance $R_D$ for which this logarithmic relationship applies. $\text{Sout}_0$ is a constant that is, for example, dependent on the specific implementation of the evaluation circuit.

Figure 3:
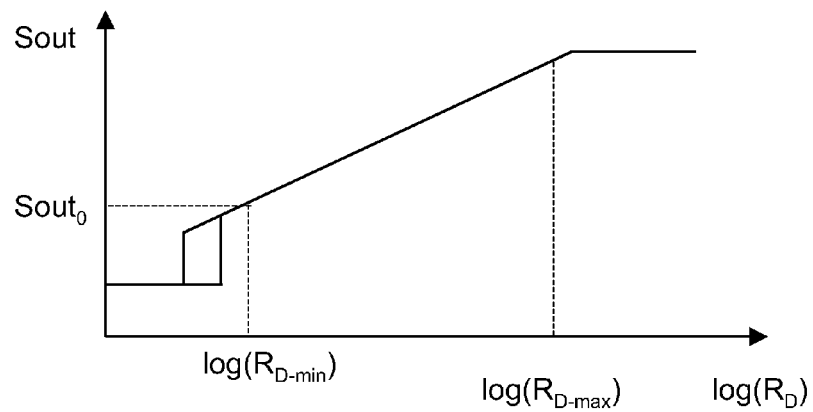
FIG. 3 illustrates one example of a relationship between an electrical resistance of the damping circuit and the output signal.

In the following $R_{D-min}$ denotes the smallest resistance value and $R_{D-max}$ denotes the largest resistance value of this resistance range. Such a logarithmic relationship between the resistance $R_D$ and the output signal Sout is schematically illustrated in FIG. 3. In this embodiment the output signal Sout for resistance values that are within the given resistance range [$R_{D-min}$, $R_{D-max}$] increases with the resistance increasing. Thus, a damping of the LC-circuit is reduced with increasing resistance.

In FIG. 3 the output signal Sout is also illustrated for resistance values higher than $R_{D-max}$ and for resistance values smaller than $R_{D-min}$. In the present example the logarithmic relationship does not apply for these higher and smaller resistance values. For smaller resistance values the characteristic curve has a hysteresis, and for even smaller resistance values an oscillating signal cannot be generated anymore, so that the output signal Sout decreases to zero. For resistance values higher than the maximum value $R_{D-max}$, the output signal Sout saturates; there is no damping of the LC-circuit for these higher resistance values.

It should be mentioned that the characteristic curve illustrated in FIG. 3 only schematically illustrates a logarithmic relationship between the resistance $R_D$ and the output signal Sout. The characteristic curve illustrated in FIG. 3 is a typical characteristic curve obtained when using a Colpitts oscillator as the oscillator circuit 3. It goes without saying that for other oscillator circuits other characteristic curves can be obtained. However, the basic principle that will be explained hereinbelow with reference to a signal transmission arrangement having a logarithmic relationship between the resistance $R_D$ and the output signal Sout does also apply to these other cases.

Further, it goes without saying that instead of varying the resistance $R_D$ of the damping circuit 1 dependent on the input signal Sin also the conductance $G_D$ of the damping circuit 1 can be varied dependent on the input signal Sin. In this case, the output signal Sout can be described as:

$$Sout = Sout_0' - \log(G_D) \quad (3),$$

wherein $Sout_0'$ is a constant.

From equations (2) and (3) it becomes clear that the output signal Sout increases with increasing resistance $R_D$ and decreases with increasing conductance $G_D$. This is due to the fact that the current flowing through the first winding 21 becomes smaller when the resistance $R_D$ increases, so that less energy is taken from the LC-circuit and a damping of the LC-circuit is reduced.

Generally, there could be a linear relationship between the input signal Sin and the resistance $R_D$. However, if there is a non-linear relationship between the resistance $R_D$ and the output signal Sout then in the receiver circuit REC the input signal Sin has to be calculated from the output signal Sout based on the known relationship between the resistance $R_D$ and the output signal Sout. Thus, according to one embodiment, a mapping of the input signal Sin to the resistance value $R_D$ in the damping circuit 1 is performed dependent on the relationship between the resistance value $R_D$ and the output signal Sout such that there is a linear relationship between the input signal Sin and the output signal Sout. Referring to equations (1a) and (1b) this is true, if the function f(.) that maps the input signal Sin to the resistance $R_D$ is the inverse function of the function g(.) that maps the resistance $R_D$ to the output signal Sout, i.e. if $f(.) = g^{-1}(.)$. Thus, when there is a logarithmic relationship between the resistance $R_D$ and the output signal Sout there is an exponential relationship between the input signal Sin and the resistance $R_D$ in order to obtain a linear relationship between the input signal Sin and the output signal Sout. A "linear relationship" in this connection means that the output signal Sout changes linearly with a linear change of the input signal Sin.

Figure 4:
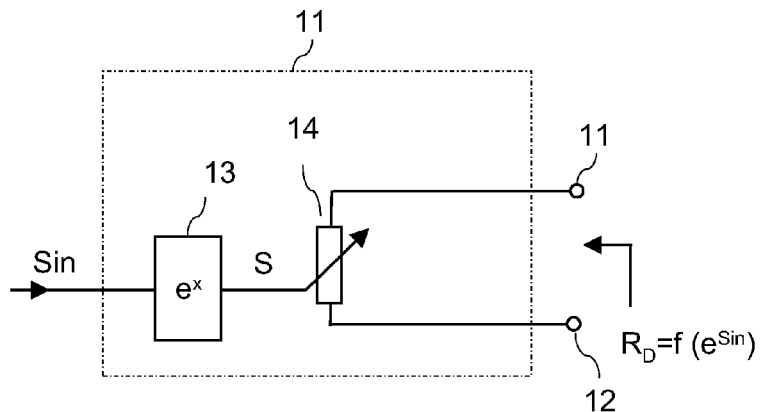
FIG. 4 schematically illustrates a first embodiment of a damping circuit.

A damping circuit 1 providing such an exponential relationship between its output resistance $R_D$ and the input signal Sin is schematically illustrated in FIG. 4. In this embodiment a function unit 13 generates a control signal S that is exponentially dependent on the input signal Sin, wherein a control signal S adjusts the resistance $R_D$ of a variable resistance circuit 14 that is connected between the output terminals 11, 12, and wherein there is a linear relationship between the output resistance $R_D$ and the control signal S. A function generator can be used to generate the control signal S dependent on the input signal Sin. Function generators, such as function generators providing an output signal that is exponentially dependent on an input signal, are commonly known, so that no further explanations are required in this regard. A variable resistor that has a resistance dependent on an input signal and that has a load path connected between the output terminals 11, 12 can be used as the variable resistance circuit. Such variable resistors are also commonly known, so that no further explanations are required in this regard. A function generator, such as function generator 13 illustrated in FIG. 4, however, usually includes operational amplifiers that have a relatively high power consumption. Further, components are not available that are easy to integrate and that have a resistance that is linearly dependent on a drive signal.

Figure 5:
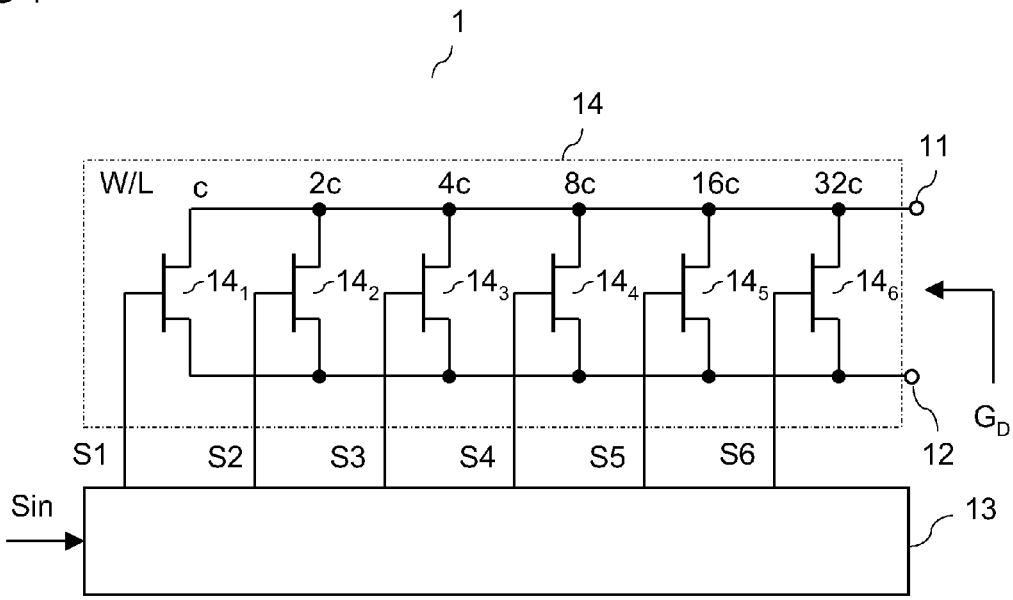
FIG. 5 illustrates one embodiment of a damping circuit having a variable resistance arrangement with a plurality of transistors and a drive circuit connected with the variable resistance arrangement.

According to one embodiment a damping circuit 1 is provided that has a low power consumption. An embodiment of such damping circuit is illustrated in FIG. 5. The damping circuit includes a variable resistance circuit 14 connected between the output terminals 11, 12 of the damping circuit 1. The variable resistance circuit 14 includes a transistor arrangement with a plurality of transistors $14_1$-$14_6$ each having a load path and a control or drive terminal. In the embodiment illustrated in FIG. 5 the transistors $14_1$-$14_6$ are MOSFETs that have a drain-source path acting as a load path, and a gate terminal acting as a control or drive terminal. The transistors $14_1$-$14_6$ have their load paths connected in parallel with each other and connected between the output terminals 11, 12. In the embodiment illustrated, the transistors $14_1$-$14_6$ have their load paths directly connected with the output terminals 11, 12. However, this is only an example. According to a further embodiment additional components, such as resistors, diodes, etc., are connected in series with the transistors $14_1$-$14_6$.

The damping circuit 1 further includes a drive circuit 13 receiving the input signal Sin and generating a drive signal S1-S6 for each of the transistors $14_1$-$14_6$ of the transistor arrangement dependent on the input signal Sin.

Figure 6:
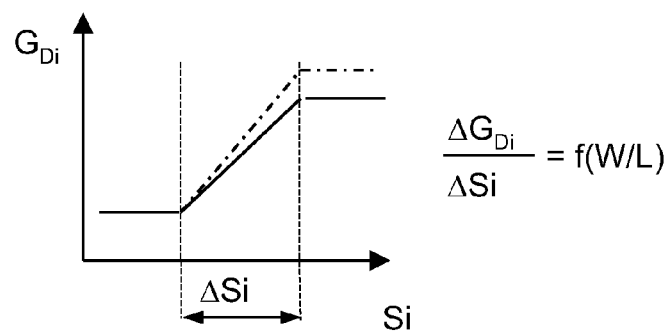
FIG. 6 illustrates the operating principle of one of the transistors of the damping circuit according to FIG. 5.

The transistors $14_1$-$14_6$ of the transistor arrangement are each operated as variable resistors, which means that the drive circuit 13 generates the drive signals S1-S6 of each of the transistors $14_1$-$14_6$ such that the resistance or conductance of one individual transistor varies when its drive signal varies within a given signal range. According to one embodiment the drive signals S1-S6 are selected such that a conductance of the load path of each of the transistors is linearly dependent on its drive signal. This is schematically illustrated in FIG. 6. FIG. 6 illustrates the conductance $G_{Di}$ of one of the transistors $14_1$-$14_6$ dependent on its drive signal Si, with i being one of 1 to 6 in the present example. $\Delta Si$ defines the signal range of the drive signal Si. For signal values of the drive signal that are within this signal range $\Delta Si$ the conductance $G_D$ increases linearly with an increase of the drive signal Si. In this connection it should be mentioned that in the present example the drive signals S1-S6 that drive the transistors $14_1$-$14_6$ define the gate-source voltages of these transistors $14_1$-$14_6$. The linear dependency of the conductance of a MOS transistor on its drive (gate-source) signal, within a give range of the drive signal, is inherent to the MOS transistors.

The slope of the characteristic curve illustrated in FIG. 6, that shows the dependency of the conductance $G_{Di}$ for a given signal range $\Delta Si$ of the drive signal Si, is dependent on a width-to-length (W/L) ratio of the transistor. FIG. 6 illustrates two different characteristic curves: A first curve shown as a solid line that represents the characteristic curve of a transistor with a first W/L ratio, and a second curve shown as a dash-dotted line that represents the characteristic curve of a transistor with a second W/L ratio that is higher than the first W/L ratio. The slope of the second characteristic curve is, therefore, higher than the slope of the first characteristic curve.

Figure 7:
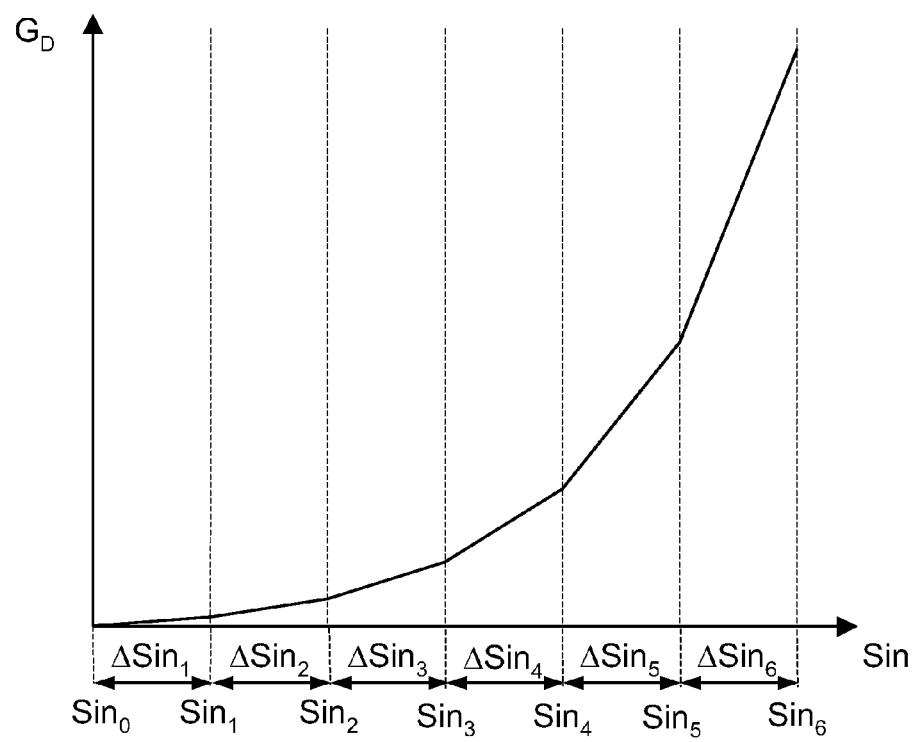
FIG. 7 illustrates a first example of a relationship between the input signal of the transmission arrangement and the conductance of the damping circuit.

According to one embodiment illustrated in FIG. 7 the W/L ratios of the transistors $14_1$-$14_6$ are selected such that there is an approximately exponential relationship between the conductance $G_D$ of the transistor arrangement 14 and the input signal Sin. FIG. 7 shows the characteristic curve of the overall conductance $G_D$ dependent on the input signal Sin. This characteristic curve has a number of piecewise linear sections, with the plurality of linear sections approximating an exponential curve. The overall conductance $G_D$ is given by the sum of the conductances of the individual transistors $14_1$-$14_6$ connected in parallel, i.e.:

$$G_D = \sum_i G_{Di} \quad (4)$$

Referring to FIG. 7, for a given signal range [$Sin_0$, $Sin_6$] of the input signal Sin there is a unique relationship between each possible value of the input signal Sin and a corresponding value of the conductance $G_D$. The approximately exponential relationship between the input signal Sin and the conductance $G_D$ is obtained by sub-dividing the given signal range [$Sin_0$, $Sin_6$] into a plurality of sub-ranges $\Delta Sin_1$-$\Delta Sin_6$. A width of the individual sub-ranges, i.e., a difference between a maximum value of a sub-range and a minimum value of this sub-range, is identical for the different sub-ranges in the embodiment illustrated in FIG. 7. However, this is only an example. According to a further embodiment the sub-ranges can be selected such that they have different widths.

For input signal values that are within one sub-range the conductance $G_D$ increases linearly with increasing input signal values. The slopes of these linear curves are chosen such that the slope of the curve of one sub-range is b times the slope of the curve of the neighboring sub-range with smaller input signal values. According to one example b=2. In this case the slope of the linear sections doubles from sub-range to sub-range for increasing input signal values.

Referring to the explanation provided in connection with FIG. 6, the slope of the conductance of one transistor for a given input signal range $\Delta Si$ is dependent on the W/L ratio. In order to obtain a characteristic curve illustrated in FIG. 7 the W/L ratios of the transistors $14_1$-$14_6$ of the transistor arrangement are selected such that the W/L ratios increase exponentially from transistor $14_1$ that has the smallest W/L ratio to transistor $14_6$ that has the highest W/L ratio. In FIG. 5, the W/L ratios of the transistors are specified for one example in which the W/L ratio doubles from transistor to transistor. In this embodiment transistor $14_1$ has a W/L ratio of c, while the largest transistor $14_6$ has a W/L ratio of 32c ($=2^6$c). In the embodiment illustrated in FIG. 5 the transistor arrangement 14 includes six transistors. Consequently the characteristic curve illustrated in FIG. 7 has six piecewise linear sections. However, this is only an example. It goes without saying that an arbitrary number of transistors, resulting in a corresponding number of piecewise linear sections of the characteristic curve, can be used. If there is a number of n transistors and if the W/L ratio of one transistor is b-times the W/L ratio of the transistor that is next smaller in size, then the W/L ratios of the transistors $14_1$, $14_2$, . . . , $14_n$ are: c ($=b^0 \cdot c$), $b^1 \cdot c$, . . . , $b^{n-1} \cdot c$, with b>1. The W/L ratio of an arbitrary one $14_i$ of these transistors is $b^{i-1} \cdot c$.

The drive circuit 13 generates the drive signal S1-S6 of the transistors such that the transistors $14_1$-$14_6$ in the order of their increasing W/L ratios are activated with increasing input signal Sin. When a value of the input signal Sin is within the first sub-range $\Delta Sin_1$ only the smallest transistor $14_1$ is activated, wherein there is a linear relationship between the input signal Sin and the conductance $G_{D1}$ of this transistor. The other transistors are deactivated in this case. When, for example a value of an input signal Sin is within a third signal range $\Delta Sin_3$, then the third transistor $14_3$ is driven such that its conductance $G_{D3}$ is linearly dependent on the input signal value, the next smaller transistors $14_1$, $14_2$ are driven such that they have their maximum conductance, and the next larger transistor $14_4$-$14_6$ are deactivated. Generally, when there is a number of n transistors and when a current value of the input signal is within a sub-range $\Delta Sin_i$ then transistor $14_i$ is driven in its linear conductance range, the smaller transistors $14_1$-$14_{i-1}$ are activated to have their maximum conductance, and the larger transistors $14_{i+1}$-$14_n$ are deactivated. The overall conductance $G_D$ is, therefore, the sum of the conductances of the activated and the deactivated transistors.

Figure 8:
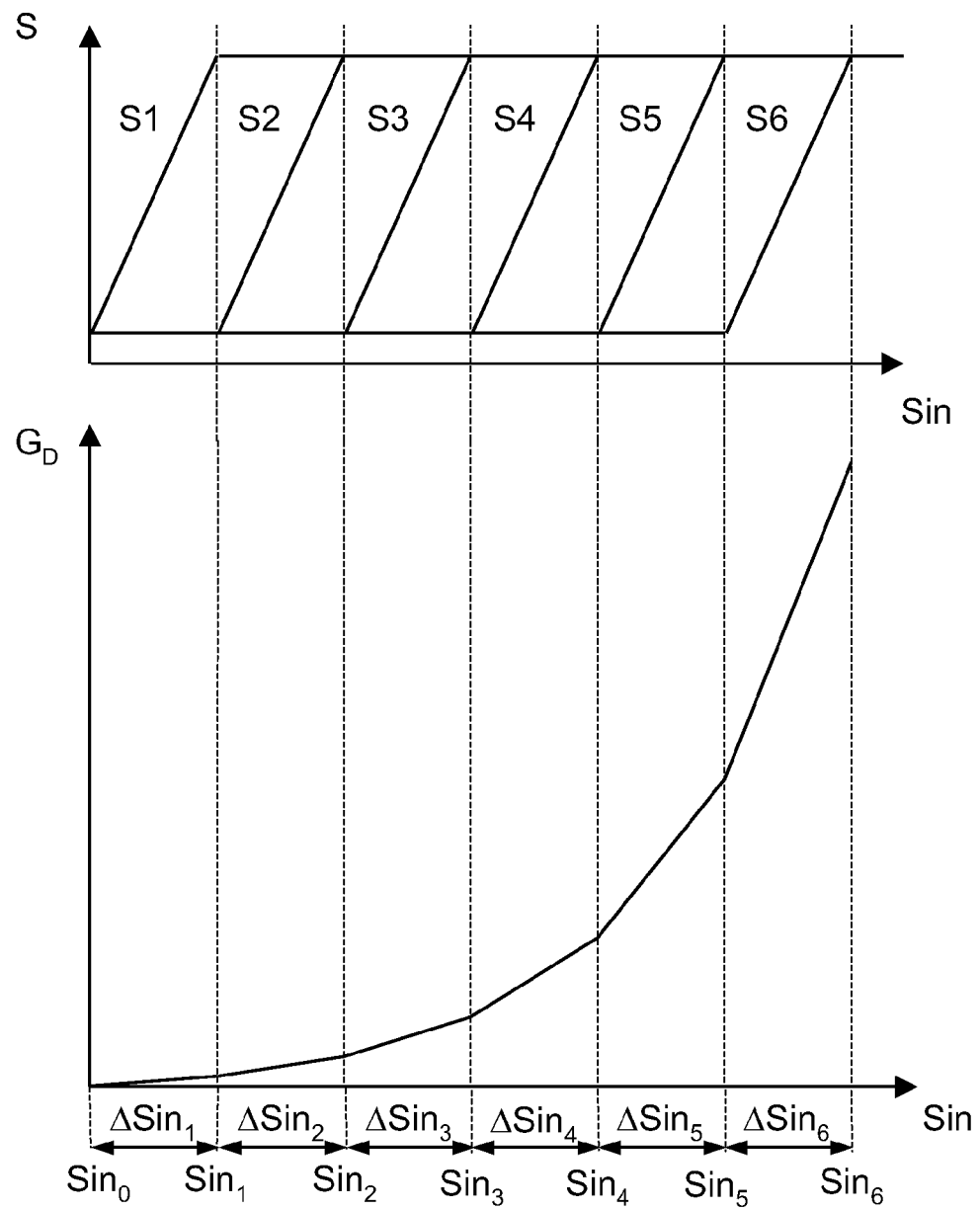
FIG. 8 illustrates a method for driving the transistors of the transistor arrangement of FIG. 5 dependent on the input signal.

FIG. 8 schematically illustrates the method explained hereinabove for driving the transistors $14_1$-$14_6$ of the transistor arrangement 14 dependent on the input signal Sin. Drive circuit 13 generates the drive signal S1-S6 such that these drive signals increase linearly for input signal values that are within a given sub-range assigned to the individual transistor. Thus, when the input signal Sin is within the first sub-range $\Delta Sin_1$, the first drive signal S1 increases linearly for signal values within this first sub-range $\Delta Sin_1$. The first drive signal S1 has a minimum value that deactivates the first transistor $14_1$ for input signal values that are below the first sub-range $\Delta Sin_1$, and the first drive signal S1 keeps its maximum value, thereby driving the first transistor $14_1$ to have its maximum conductance, for input signal values Sin that are above the first sub-range. In general, a drive signal Si increases linearly for input signal values of a given sub-range $\Delta Sin_i$. For input signal values below this sub-range $\Delta Sin_i$ the drive signal Si has its minimum signal value, thereby deactivating the corresponding transistor $14_i$. For signal values above the sub-range $\Delta Sin_i$ the drive signal Si has its maximum value, thereby driving the corresponding transistor $14_i$ to have its maximum conductance.

Figure 9:
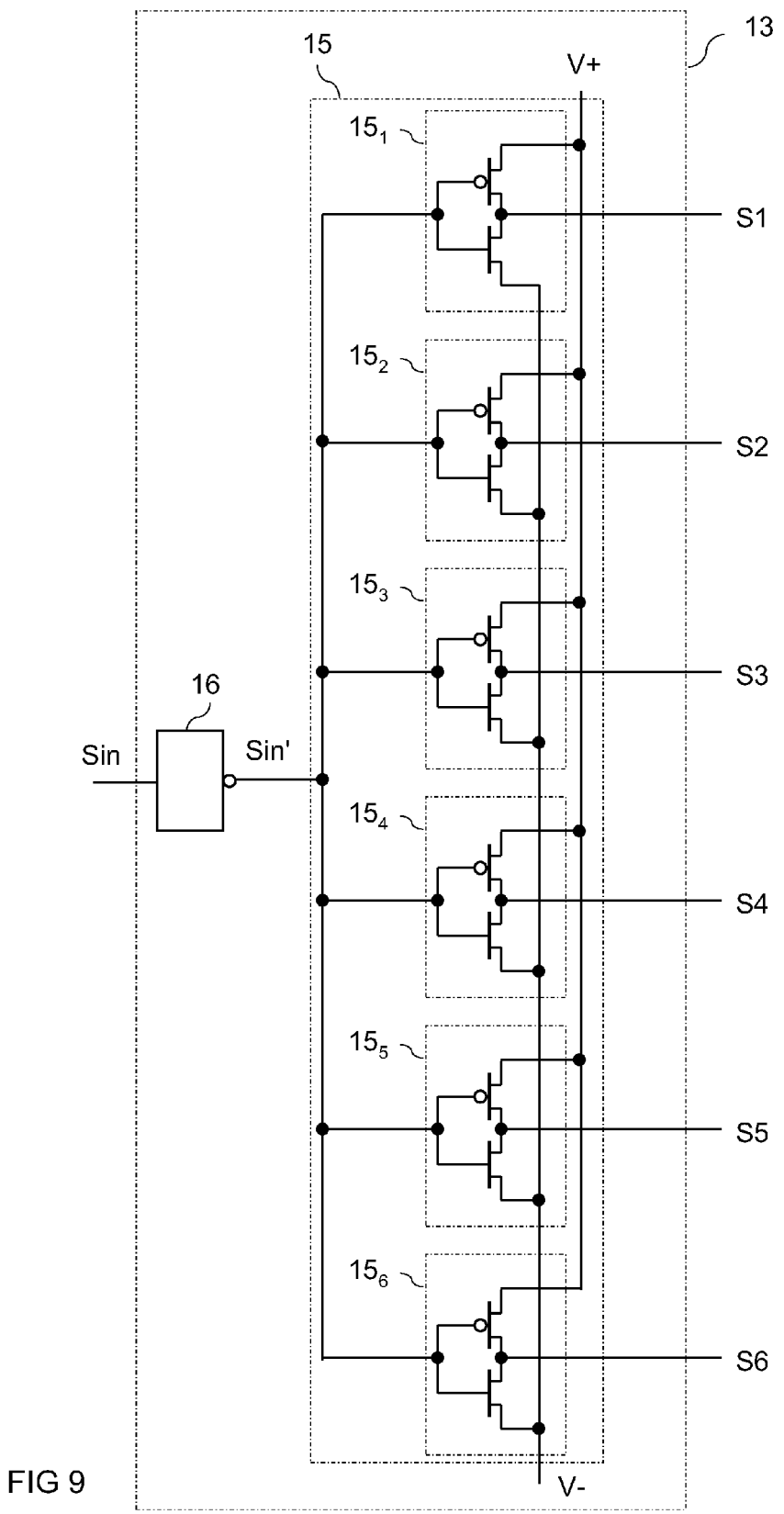
FIG. 9 illustrates one embodiment of a drive circuit that includes a plurality of drive units.

FIG. 9 illustrates one embodiment of a drive circuit 13 providing the drive signals S1-S6. The drive circuit 13 has an output stage 15 with a plurality of drive units $15_1$-$15_6$, wherein each of these driver units $15_1$ generates the drive signal S1 for one of the transistors ($14_1$-$14_6$ in FIG. 5). The number of drive units, therefore, corresponds to the number of transistors $14_1$-$14_6$ to be driven. In the embodiment illustrated in FIG. 9 each of these driver units $15_1$-$15_6$ includes a CMOS inverter with a p-MOSFET and a n-MOSFET. These MOSFETs have their load paths connected in series with each other between a terminal for a positive supply potential V+ and a terminal for a negative supply potential V−. The two transistors are driven by a common drive signal Sin'. Each of the drive signals $S_1$-$S_6$ is available at output of one of the CMOS inverters, wherein an output of one CMOS inverter is formed by a circuit node that is common to the load paths of the two complementary transistors of one inverter.

Figure 10:
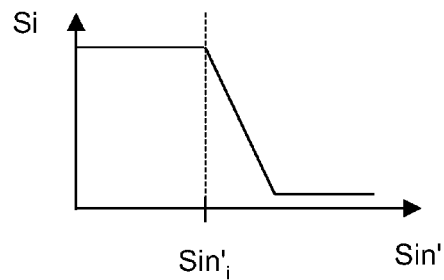
FIG. 10 illustrates the operating principle of one of the drive units of FIG. 9.

The operating principle of an arbitrary one $15_i$ of these drive units $15_1$-$15_6$ is illustrated in FIG. 10. FIG. 10 schematically illustrates the output signal Si of this drive unit dependent on its input signal Sin'. The output signal Si has a maximum value for input signal values that are below a threshold value $Sin_i'$. This maximum value may correspond to the positive supply potential V+. For values of the inverter input signal Sin' that are above the threshold value $Sin_i'$ the output signal Si decreases until a minimum value, which can correspond to the negative supply potential V−, is reached.

It is commonly known that in CMOS inverters the threshold voltage, such as voltage $Sin_i'$ illustrated in FIG. 10, can be defined by the ratio between the W/L ratio of the p-MOSFET and the W/L ratio of the n-MOSFET in the inverter. In the following a ratio between the W/L ratio of the p-MOSFET and the W/L ratio of the n-MOSFET will be referred to as size ratio of the transistors of one inverter stage. The size ratio is 1 if the two transistors have identical W/L ratios, the size ratio is higher than 1 when the W/L ratio of the p-MOSFET is higher than the W/L ratio of the n-MOSFET, and the size ratio is smaller than 1 when the W/L ratio of the p-MOSFET is smaller than the W/L ratio of the n-MOSFET. The size ratio of the transistors of the inverter stage defines the threshold value, such as the threshold value $Sin_i'$ illustrated in FIG. 10, wherein the threshold value increases with increasing size ratio, i.e. the inverter stage with the highest size ratio has the highest threshold voltage and the inverter stage with the lowest size ratio has the smallest threshold voltage.

Referring to FIG. 10, the output signal Si of the inverter stages $15_1$-$15_i$ decrease when the input signal Sin' increases. In order to obtain the desired relationship illustrated in FIG. 8, in which the drive signals S1-S6 increase with increasing input signal Sin, drive circuit 13 additionally includes an inverter stage 16 that receives the input signal Sin and that provides the output signals Sin' of the drive units or inverter stages $15_1$-$15_6$ in the output stage. Inverter stage 16, for example, generates its output signal Sin' from the input signal Sin according to the following relationship:

$$Sin'=S_0-Sin \quad (4).$$

$S_0$ equals, for example, the maximum input signal value $Sin_6$.

Figure 12:
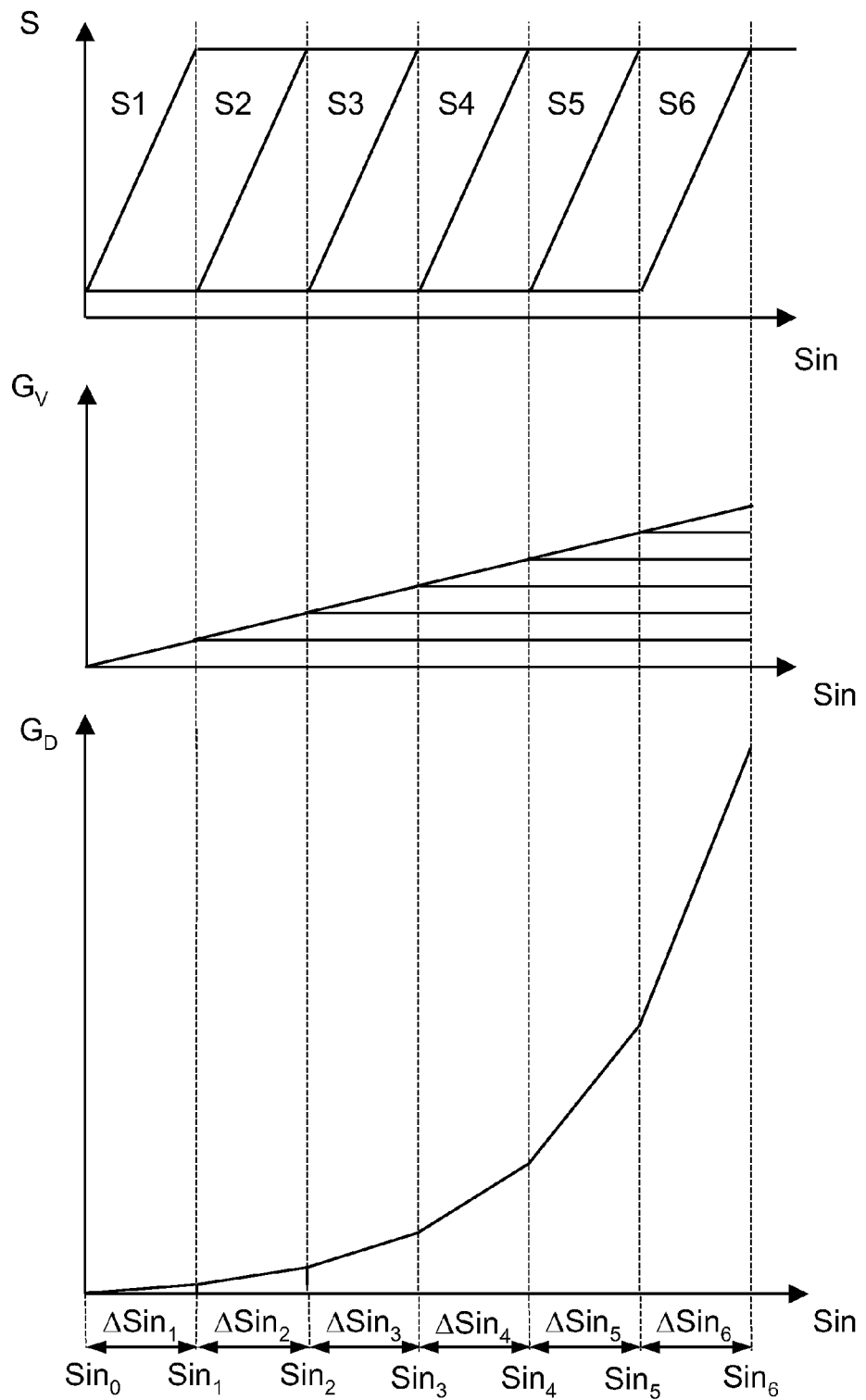
FIG. 12 illustrates the operating principle of the damping circuit of FIG. 11.

In order to obtain the plurality of piecewise linear sections illustrated in FIG. 12, wherein for each of these sections the drive signals S1-S6 linearly increase for input signal values that are within a given sub-range, the threshold voltages of the CMOS inverters are, by adjusting the size ratio of their transistors, selected such that these threshold values correspond to the value at the lower boarder of each sub-range. For example, inverter stage $15_3$ that generates the drive signal S3 for transistor $14_3$ has a threshold value that corresponds to $Sin_2$, which is the lower border of the sub-range $\Delta Sin_3$ assigned to the third transistor $14_3$.

In order to simplify the illustration, FIG. 10 for input signal values that are within a given signal range, that has the threshold value $Sin_i'$ as a lower border, shows a linear relationship between the output signal Sin of one inverter stage and its input signal Sin'. However, in CMOS inverters there is usually no such exact linear relationship between the input signal and the output signal.

Figure 11:
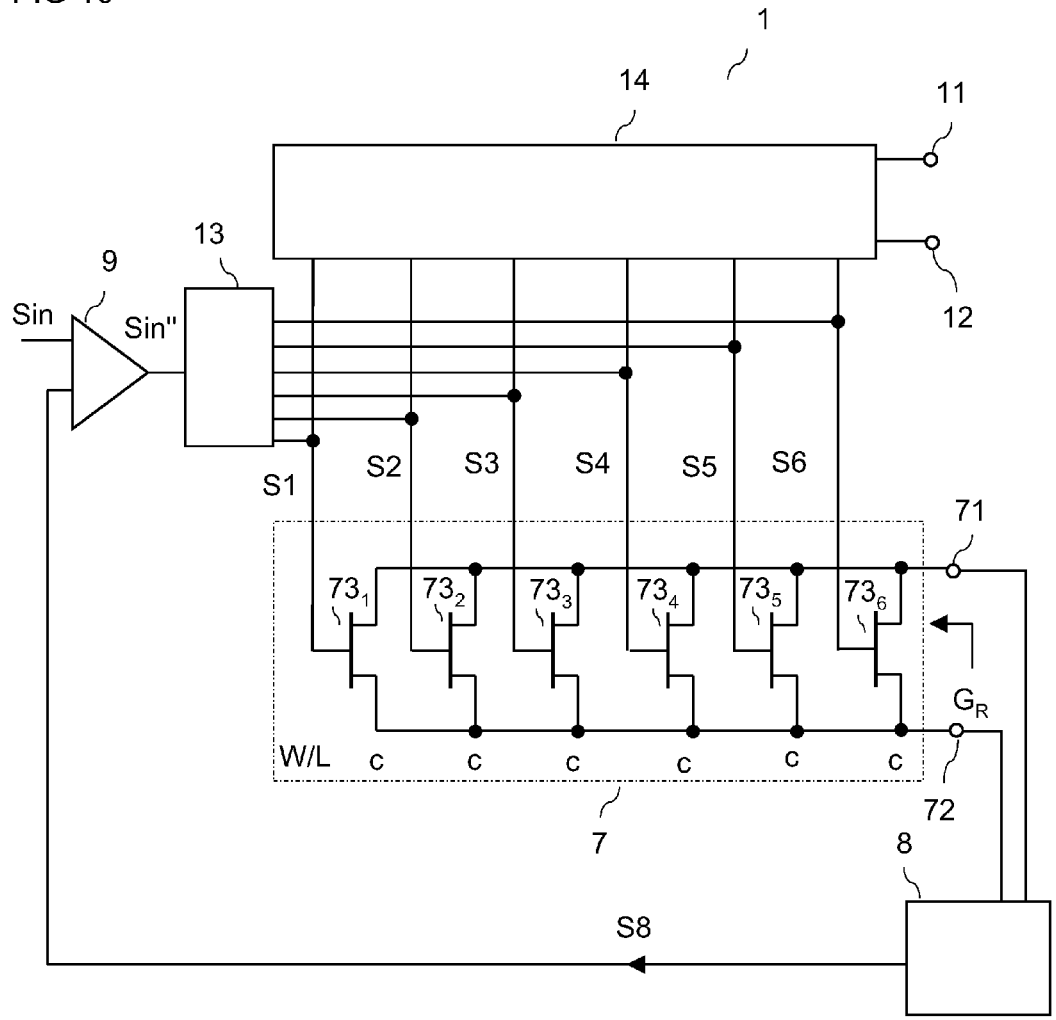
FIG. 11 illustrates an embodiment of a damping circuit that includes a control loop with a reference circuit.

To compensate for a non-linear behavior of the drive circuit 13 resulting from this a control loop is provided in one embodiment of the damping circuit 1. Such damping circuit 1 with a control loop is schematically illustrated in FIG. 11. This damping circuit besides the variable resistance arrangement 14 and its drive circuit 13 has a control loop. The control loop includes a reference circuit 7 that receives the drive signals S1-S6 generated by the drive circuit 13. In the embodiment illustrated in FIG. 11, the reference circuit 7 is implemented similarly to the variable resistance arrangement 14 and includes a plurality of transistors $73_1$-$73_6$ that have their load paths connected in parallel between output terminals 71, 72. Each of these transistors $73_1$, $73_6$ receives one of the drive signals S1-S6. The number of transistors in the reference circuit 7 corresponds to the number of transistors in the transistor arrangement of the variable resistance arrangement 14. The reference circuit is different from the transistor arrangement in that the transistors $73_1$-$73_6$ of the reference circuit 7 have identical W/L ratios. Thus, when driving these transistors with drive signals S1-S6 that each linearly increase within a given sub-range of the input signal Sin, an output conductance $G_R$ of the reference circuit 7 increases linearly when the output conductance $G_D$ of the variable resistance arrangement 14 increases exponentially in the manner illustrated in FIGS. 5 and 8. The linear increase of the output conductance $G_R$ of the reference circuit 7 dependent on the drive signals S1-S6 is illustrated in FIG. 12, in which also the output conductance $G_D$ of the variable resistance circuit 14 and the drive signals S1-S6 are illustrated. A measurement circuit 8 measures the output conductance $G_R$ of the reference circuit 7 and feeds a measurement signal S8 that is proportional to the output conductance $G_R$ to a controller 9. Controller 9 receives the input signal Sin and the measurement signal S8 and provides an input signal Sin" to the drive circuit 13. The control loop helps to generate the drive signals S1-S6 such that there is a linear relationship between the input signal Sin and the output conductance $G_R$ of the reference circuit 7. In this case the output conductance $G_D$ and the input signal Sin have the desired exponential relationship, even in those cases, in which there is non-linearity in the drive circuit 13.

In the damping circuit with the control loop a drive input signal received by the drive circuit 13 is not the input signal, like in the embodiments illustrated hereinabove, but a signal that is dependent on the input signal, namely a signal that is available at the controller 9 output.

It goes without saying, that by suitably dividing the input signal range [$Sin_0$, $Sin_6$] into sub-ranges and by suitably selecting the W/L ratios of the transistors $14_1$-$14_6$ any non-linear relationship, other than an exponential relationship, between the input signal Sin and the conductance $G_D$ of the damping circuit 1 can be adjusted. Additionally, the relationship between the input signal Sin and the conductance $G_D$ can be adjusted by the reference circuit 7. According to one embodiment the W/L ratios of the transistors $73_1$-$73_6$ are not equal. In this case the relationship between the input signal Sin and the reference conductance $G_V$ is not a linear relationship, which also affects the relationship between the input signal Sin and the conductance $G_D$ of the damping circuit 1.

In the embodiments explained hereinabove there is an increase of the conductance $G_D$ with increasing input signal Sin. The transmission arrangement could also be implemented such that the conductance $G_D$ decreases with increasing input signal. However, there is always a unique relationship between the values of the input signal Sin and the values of the conductance $G_D$, and between the values of the conductance $G_D$ and the values of the output signal, so that there is a unique relationship between values of the input signal Sin and values of the output signal Sout.

Figure 13:
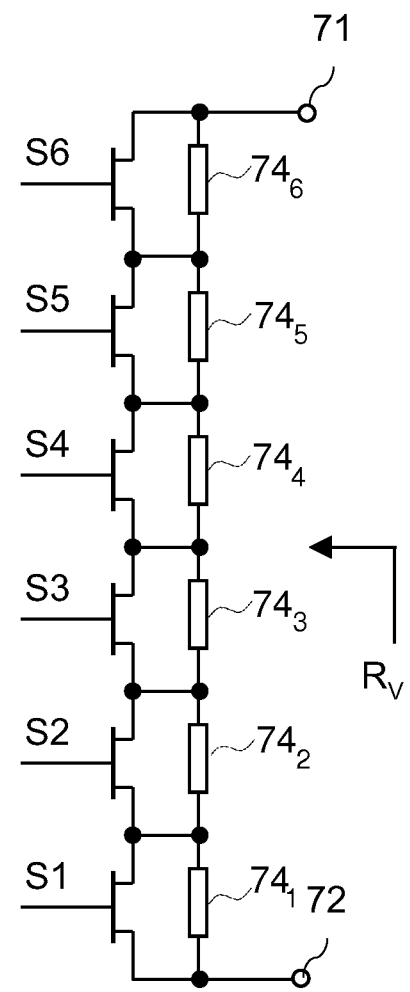
FIG. 13 illustrates a second embodiment of a transistor arrangement of the reference circuit.

FIG. 13 illustrates a further embodiment of the reference circuit 7. This reference circuit 7 has the load paths of the transistors $14_1$-$14_6$ not connected in parallel but connected in series, wherein resistors $74_1$-$74_6$ are connected in parallel with each of the transistors. According to one embodiment, the W/L ratio of the different transistors $73_1$, $73_6$ is identical. In this arrangement an output resistance $R_D$ is linearly dependent on the input signal Sin, when the drive signals S1-S6 are generated in the manner illustrated in FIGS. 8 and 12, and when an overall voltage drop between the terminals 11, 12 is small compared with the amplitudes of the drive signal S1-S6.

The reference circuit 7 of FIG. 13 when driven with the input signals S1-S6 has a resistance $R_V$ that is linearly dependent on the input signal Sin. When using the reference circuit 7 of FIG. 13 in the control loop illustrated in FIG. 11, a measurement circuit 8 is used that is adapted to evaluate the resistance $R_V$, instead of the conductance $G_V$, and to provide the measurement signal S8 to be dependent on the resistance $R_V$.

Figure 14:
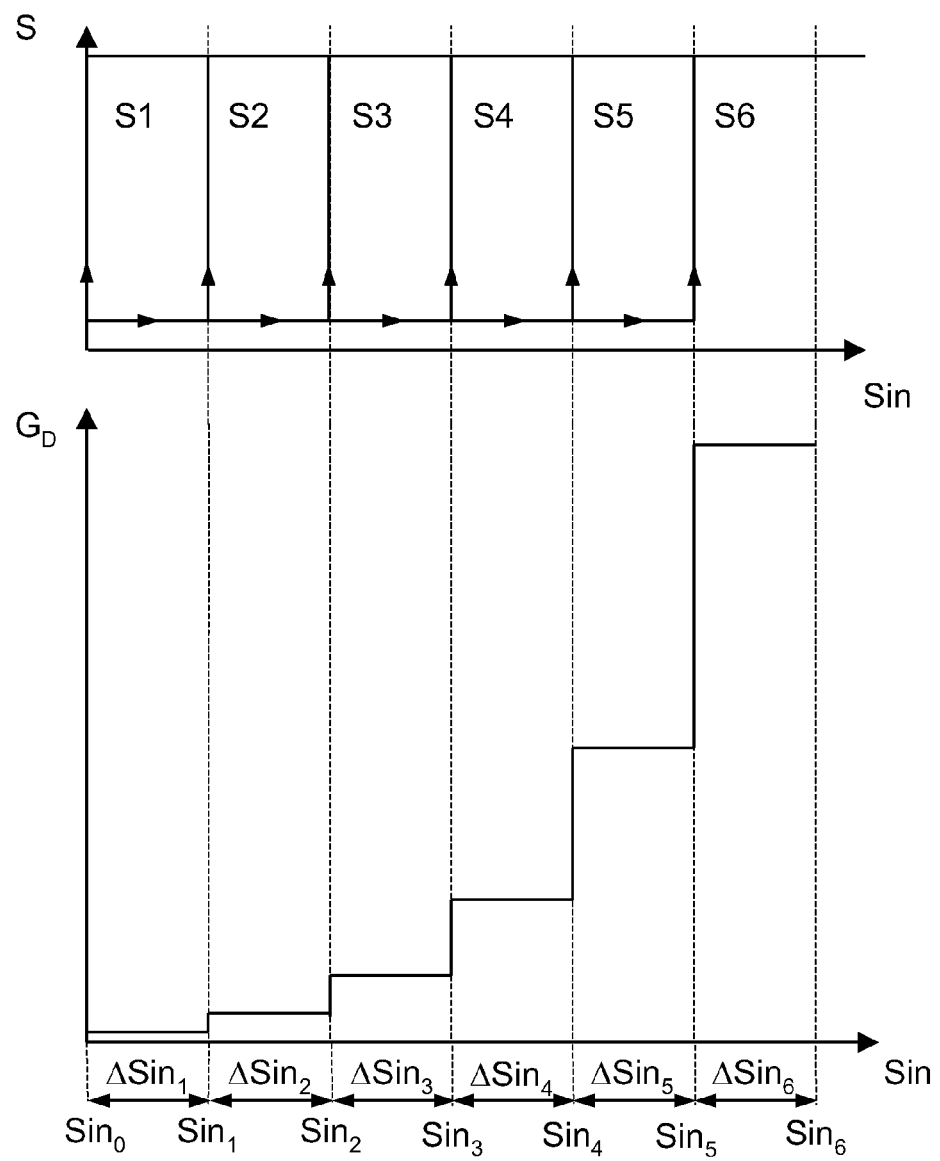
FIG. 14 illustrates the operating principle of a signal transmission arrangement and a signal transmission method according to a further embodiment.

FIG. 14 illustrates the operating principle of a signal transmission circuit according to a further embodiment. In this embodiment a desired relationship between the input signal Sin and the conductance $G_D$ is approximated by piecewise constant sections. The characteristic curve of FIG. 14 can be obtained using a variable resistance arrangement 14 of FIG. 5 in which the drive signals S1-S6 of the transistors $14_1$-$14_6$ are generated such that the transistors $14_1$-$14_6$ a only either switched on or off. An arbitrary one $14_i$ of the transistors $14_1$-$14_6$ is switched on when the input signal reaches the lower threshold value $Sin_i$ of the sub-range $\Delta Sin_i$ assigned to the transistor $14_i$. The number of different input signal Sin values that can be transmitted with such signal transmission circuit is dependent on the number of transistor $14_1$-$14_6$ that is employed. According to an embodiment 256 (=$2^8$) transistors are used, so that 256 different conductances $G_D$ can be adjusted and 256 different input signal Sin values can be transmitted. In this case the transmission arrangement is suitable to transmit the information included in an 8 bit digital signal. Such an 8 bit signal is, for example, obtained from an analog signal using an 8 bit ADC (analog-to-digital converter). Generally, the number of transistors can be $2^m$, with m>1.

In the embodiments illustrated before, the sub-ranges of the input signal Sin, that can be assigned to the individual transistors of the variable resistance arrangement 14, do not overlap, but the sub-ranges adjoin one another, i.e., the upper threshold value of one sub-range equals the lower threshold value of the next higher sub-range. However, this is only an example. According to a further embodiment, these sun-ranges overlap, i.e., the upper threshold value of one sub-range lies within the next higher sub-range.

Finally it should be mentioned that features that have been explained in connection with one embodiment can be combined with features of other embodiment, even in those cases in which this has not explicitly been mentioned.

What is claimed is:

1. A signal transmission arrangement, comprising:
   a transformer comprising a first winding and a second winding;
   a damping circuit comprising an input terminal configured to receive an input signal, wherein the damping circuit is coupled to the first winding, and wherein the damping circuit is configured to have an electrical resistance dependent on the input signal;
   an oscillator circuit comprising the second winding, wherein the oscillator circuit is configured to provide an analog oscillating signal, wherein an amplitude of the analog oscillating signal varies dependent on an output of the damping circuit; and
   an evaluation circuit configured to receive the analog oscillating signal, and to provide an output signal that is dependent on the amplitude of the analog oscillating signal.

2. The signal transmission arrangement of claim 1, wherein the oscillator circuit comprises an LC-circuit comprising the second winding and an amplifier coupled to the LC-circuit.

3. The signal transmission arrangement of claim 2, wherein the oscillator circuit comprises a Colpitts oscillator.

4. The signal transmission arrangement of claim 1, wherein the damping circuit comprises:
   a variable resistance arrangement comprising a first output terminal coupled to the first winding and a second output terminal coupled to the first winding; and
   a drive circuit configured to receive a drive input signal and to generate a drive signal for the variable resistance arrangement dependent on the drive input signal, wherein the drive input signal is dependent on the input signal of the damping circuit.

5. A signal transmission arrangement, comprising:
   a transformer comprising a first winding and a second winding;
   a damping circuit configured to receive an input signal, wherein the damping circuit is coupled to the first winding, wherein the damping circuit is configured to have an electrical resistance dependent on the input signal, and wherein the damping circuit comprises
      a variable resistance arrangement comprising a first output terminal coupled to the first winding and a second output terminal coupled to the first winding, and
      a drive circuit configured to receive a drive input signal and to generate a drive signal for the variable resistance arrangement dependent on the drive input signal, wherein the drive input signal is dependent on the input signal;
   an oscillator circuit comprising the second winding and configured to provide an oscillating signal;
   wherein the variable resistance arrangement comprises a transistor arrangement comprising a plurality of transistors, wherein a transistor of the plurality of transistors comprises a control terminal configured to receive a drive signal and a load path, wherein the load path is coupled between the first output terminal of the variable resistance arrangement of the damping circuit and the second output terminal of the variable resistance arrangement of the damping circuit; and
   wherein the drive circuit is configured to generate a drive signal for the plurality of transistors dependent on the drive input signal.

6. The signal transmission arrangement of claim 5, wherein the load paths of the plurality of transistors are connected in parallel between the first output terminal of the variable resistance arrangement of the damping circuit and the second output terminal of the variable resistance arrangement of the damping circuit.

7. The signal transmission arrangement of claim 5, wherein the transistors have different W/L) ratios.

8. The signal transmission arrangement of claim 7, wherein a second W/L ratio of a second transistor is exponentially larger than a first W/L ratio of a first transistor.

9. The signal transmission arrangement of claim 5, wherein a first transistor of the plurality of transistors has a first signal range and a second transistor of the plurality of transistors has a second signal range, and wherein the drive circuit is configured to drive the first transistor such that an on-resistance of the first transistor varies within the first signal range.

10. The signal transmission arrangement of claim 9, wherein the first signal range is adjacent with the second signal range.

11. The signal transmission arrangement of claim 9, wherein the first signal range overlaps with the second signal range.

12. The signal transmission arrangement of claim 5, wherein the drive circuit comprises a plurality of drive units, wherein the plurality of drive units is configured to receive the drive input signal or an inverted drive input signal and to provide a drive signal for the plurality of transistors.

13. The signal transmission arrangement of claim 12, wherein a drive unit of the plurality of drive units comprises an inverter comprising a first transistor and a second transistor, wherein the inverters of the plurality of drive units have different ratios between a W/L ratio of the first transistor and a W/L ratio of the second transistor.

14. The signal transmission arrangement of claim 4, wherein the damping circuit further comprises:
a control loop comprising a reference circuit configured to receive the drive signal and to provide a reference signal and a controller configured to provide the drive input signal dependent on the input signal and the reference signal.

15. The signal transmission arrangement of claim 14, wherein the reference circuit comprises a transistor arrangement, and wherein the reference signal is dependent on an electrical resistance of the transistor arrangement.

16. The signal transmission arrangement of claim 1, wherein the transformer comprises a coreless transformer.

17. A signal transmission method performed using a signal transmission arrangement that comprises a transformer comprising a first winding and a second winding, an oscillator circuit comprising the second winding and configured to provide an analog oscillating signal based on an output of a damping circuit, and the damping circuit connected to the first winding, the method comprising:
receiving an input signal;
damping the input signal comprising varying an electrical resistance of the damping circuit based on the input signal; and
generating the analog oscillating signal, wherein an amplitude of the analog oscillating signal varies based on the damped input signal.

18. The method of claim 17, wherein generating an analog oscillating signal comprises using a Colpitts oscillator.

19. The method of claim 17, wherein damping the input signal further comprises:
generating a drive signal for a plurality of transistors based on a drive input signal; and
applying the input signal to a variable resistance arrangement comprising a first output terminal coupled to the first winding and a second output terminal coupled to the first winding, wherein the variable resistance arrangement comprises a transistor arrangement comprising a plurality of transistors having a control terminal and a load path, wherein the plurality of transistors is configured to receive a drive signal, and wherein the load path of the plurality of transistors is coupled between the first output terminal of the variable resistance arrangement of the damping circuit and the second output terminal of the variable resistance arrangement of the damping circuit.

20. The method of claim 17, wherein the transformer comprises a coreless transformer.

* * * * *